US012570485B2

(12) United States Patent
Lee et al.

(10) Patent No.: US 12,570,485 B2
(45) Date of Patent: Mar. 10, 2026

(54) SUBSTRATE TRANSFER APPARATUS USING UPPER AND LOWER MAGNETIC LEVITATION RAILS

(71) Applicant: VM Inc., Icheonsi (KR)

(72) Inventors: Sang Woo Lee, Suwon-si (KR); Woo Hyung Choi, Seongnam-si (KR)

(73) Assignee: VM Inc., Icheonsi (KR)

( * ) Notice: Subject to any disclaimer, the term of this patent is extended or adjusted under 35 U.S.C. 154(b) by 239 days.

(21) Appl. No.: 18/515,108

(22) Filed: Nov. 20, 2023

(65) Prior Publication Data

US 2025/0026590 A1      Jan. 23, 2025

(30) Foreign Application Priority Data

Jul. 21, 2023      (KR) ........................ 10-2023-0095255

(51) Int. Cl.
B65G 54/02      (2006.01)
B65G 47/90      (2006.01)
H01L 21/67      (2006.01)
H01L 21/677      (2006.01)

(52) U.S. Cl.
CPC .............. B65G 54/02 (2013.01); B65G 47/90 (2013.01); H01L 21/67709 (2013.01); H01L 21/67715 (2013.01); H01L 21/67724 (2013.01); H01L 21/67173 (2013.01); H01L 21/6773 (2013.01)

(58) Field of Classification Search
CPC ......... H01L 21/67724; H01L 21/67709; H01L 21/67715; H01L 21/67173; H01L 21/6773; B65G 54/02

USPC .......................................................... 198/805
See application file for complete search history.

(56) References Cited

U.S. PATENT DOCUMENTS

| | | | | |
|---|---|---|---|---|
| 2006/0285945 A1* | 12/2006 | Hofmeister | ....... H01L 21/67742 | |
| | | | | 414/217 |
| 2017/0250379 A1 | 8/2017 | Verplancken | | |
| 2022/0130710 A1* | 4/2022 | Han | ........................ G03F 7/168 | |
| 2022/0140762 A1* | 5/2022 | Kimura | ................ H02K 41/031 | |
| | | | | 318/135 |

FOREIGN PATENT DOCUMENTS

| | | | | | |
|---|---|---|---|---|---|
| JP | 2003-087910 A | 3/2003 | | | |
| JP | 2021-534591 A | 12/2021 | | | |
| JP | 2022-508019 A | 1/2022 | | | |
| JP | 2022-113548 A | 8/2022 | | | |
| JP | 2023-518372 A | 5/2023 | | | |
| KR | 10-0505183 B1 | 8/2005 | | | |
| KR | 10-0707390 B1 | 4/2007 | | | |
| KR | 10-2013-0128117 A | 11/2013 | | | |
| KR | 10-1511242 B1 | 4/2015 | | | |
| KR | 10-2015-0078173 A | 7/2015 | | | |
| KR | 10-2001970 B1 | 7/2019 | | | |
| KR | 20220015138 A | * | 2/2022 | ............. | B65G 54/02 |

(Continued)

*Primary Examiner* — James R Bidwell
(74) *Attorney, Agent, or Firm* — Park, Kim & Suh, LLC

(57) ABSTRACT

Disclosed is a substrate transfer apparatus including a moving plate including an upper magnetic levitation rail and a lower magnetic levitation rail, a processing chamber disposed adjacent to the moving plate and that processes a substrate, and a shuttle disposed between the upper magnetic levitation rail and the lower magnetic levitation rail, being moved on the moving plate, and that accommodates the substrate.

12 Claims, 4 Drawing Sheets

(56)         References Cited

FOREIGN PATENT DOCUMENTS

| TW | 518649 | B | 1/2003 |
| TW | 202141675 | A | 11/2021 |
| WO | 2023-049200 | A1 | 3/2023 |

* cited by examiner

SUBSTRATE TRANSFER APPARATUS USING UPPER AND LOWER MAGNETIC LEVITATION RAILS

CROSS-REFERENCE TO RELATED APPLICATIONS

This application claims priority under 35 U.S.C. § 119 to Korean Patent Application No. 10-2023-0095255 filed on 21 Jul. 2023, in the Korean Intellectual Property Office, the disclosures of which are incorporated by reference herein in their entireties.

BACKGROUND

Embodiments of the present disclosure described herein relate to a substrate transfer apparatus, and more particularly, relate to a substrate transfer apparatus including upper and lower magnetic levitation rails.

A throughput in equipment used for a semiconductor or display process refers to an amount of processing of waters or substrates per unit time in a single process. The throughput may be determined based on a processing time of a processing chamber, a processing speed of a vacuum robot, a vacuum/standby switching speed of a system, a cooling/heating time of a wafer, and creation of a process environment before a process. However, there is a limit in maximizing a throughput of equipment only with the factors.

SUMMARY

Embodiments of the present disclosure relates to a substrate transfer apparatus that stably transfers a substrate by using upper and lower magnetic levitation rails.

According to an embodiment of the present disclosure, a substrate transfer apparatus includes a moving plate including an upper magnetic levitation rail and a lower magnetic levitation rail, a processing chamber disposed adjacent to the moving plate and configured to process a substrate, and a shuttle disposed between the upper magnetic levitation rail and the lower magnetic levitation rail, being moved on the moving plate, and configured to accommodate the substrate.

Here, the shuttle may include a first space and a second space configured to accommodate one or more substrates, and the first space and the second space may be separated from each other.

Here, the first space may be disposed on an upper side of the second space.

Here, the first space may accommodate a substrate that is to be processed in the processing chamber, and the second space may accommodate a substrate that is processed in the processing chamber.

Here, the shuttle may include a first permanent magnet disposed to face the upper magnetic levitation rail, and a second permanent magnet disposed to face the lower magnetic levitation rail.

Here, the shuttle may include a support member configured to support the substrate, and a frictional member may be disposed on one surface of the support member.

Here, the shuttle may include a sensor configured to sense an environment of an interior of the first space, an interior of the second space, the moving plate, or the processing chamber.

Here, the sensor may be a temperature sensor, a humidity sensor, a vibration sensor, a weight sensor, or an inclination sensor.

Here, the moving plate may include a fixing pin configured to fix a location of the shuttle, and the fixing pin may be disposed between electromagnets of the upper magnetic levitation rail or the lower magnetic levitation rail.

Here, the fixing pin may contact the shuttle or passes through one surface of the shuttle to fix the location of the shuttle.

Here, an impact absorbing member may be disposed on one surface of the first space or the second space.

Here, the sensor may be formed in the same form as that of the substrate.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
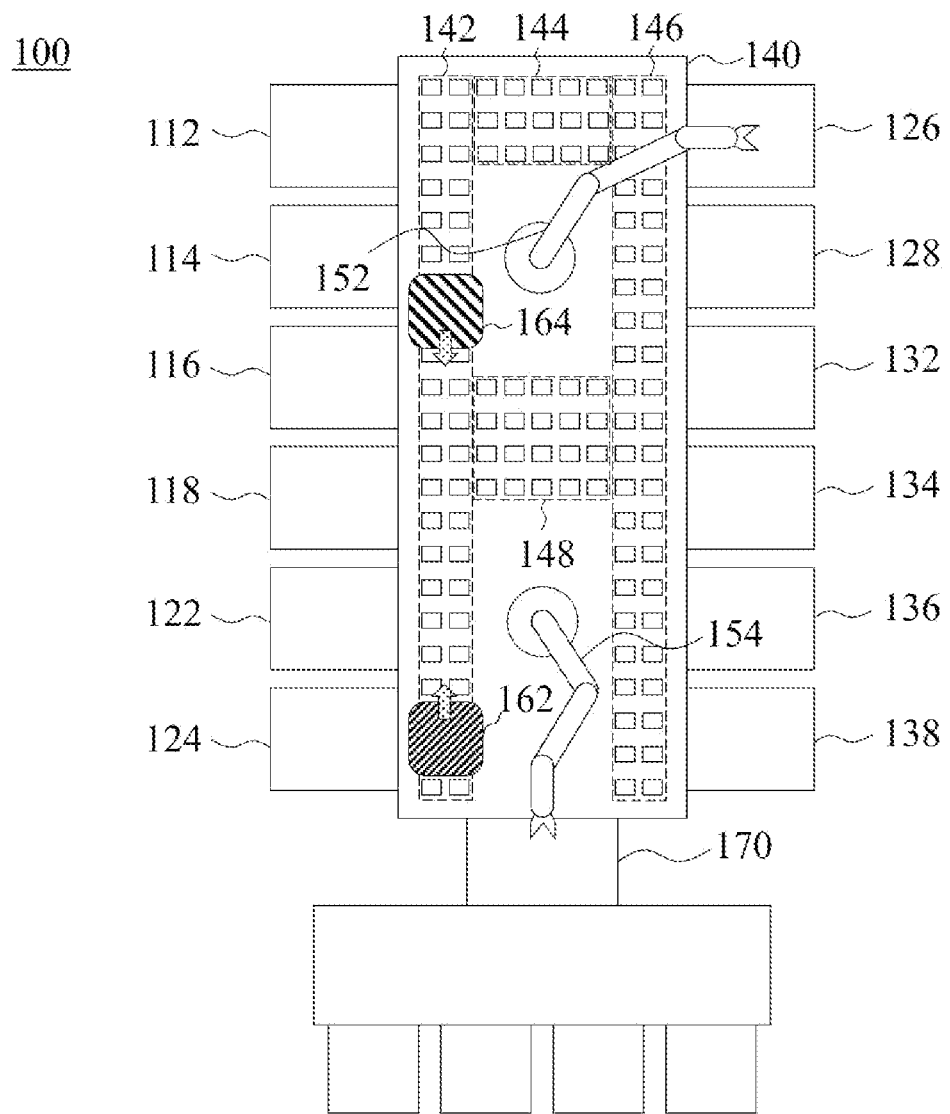
FIG. 1 is a view illustrating a substrate transfer process using a substrate transfer apparatus according to an embodiment.

The embodiments disclosed in the specification is for clearly explaining the spirits of the present disclosure to an ordinary person in the art, to which the present disclosure pertains, and thus, the present disclosure is not limited to the embodiments disclosed in the specification, and the scope of the present disclosure should be construed as including corrections or modifications that do not depart from the spirits of the present disclosure.

General terms used as currently widely as possible are selected as the terms used in the specification in consideration of the functions in the present disclosure, but the terms used in the specification may be changed according to an intention of an ordinary person in the art, to which the present disclosure pertains, a precedent, or advent of a new technology. However, unlike this, when a specific term is defined as an arbitrary meaning to be used, the meaning of the term will be described separately. Accordingly, the terms used in the specification should be construed based on not the simple names of the terms but substantial meanings of the terms and the contents over the specification.

The drawings attached to the specification are for easily explaining the present disclosure, and the shapes illustrated in the drawings are exaggerated according to necessities to help understanding of the present disclosure, and thus the present disclosure is not limited by the drawings.

In the specification, when it is determined that a detailed description of known configurations or functions related to the present disclosure may make the essence of the present disclosure unclear, a detailed description thereof will be omitted according to necessities.

FIG. 1 is a view illustrating a substrate transfer process using a substrate transfer apparatus according to an embodiment.

Referring to FIG. 1, a substrate transfer apparatus 100 according to an embodiment may include at least one of a plurality of processing chambers 112 to 138, a moving plate 140, magnetic levitation rails 142 to 148, a plurality of arms 152 and 154, and a plurality of shuttles 162 and 164.

The first shuttle 162 and/or the second shuttle 164 may be moved along the magnetic levitation rails 142 to 148 to transfer a substrate (hereinafter, the first shuttle 162 will be mainly described). In detail, the first shuttle 162 may acquire a substrate from any one of the plurality of processing chambers 112 to 138, and may transfer the acquired substrate along the magnetic levitation rails 142 to 146. Thereafter, the substrate may be delivered to a load lock chamber 170 by at least one of the plurality of arms 152 and 154.

The magnetic levitation rails 142 to 148 may include a plurality of areas. In detail, the magnetic levitation rails 142 to 148 may include the first rail area 142 that is disposed at one periphery of one surface of the moving plate 140 along a longitudinal direction and/or the second rail area 146 that is disposed at an opposite periphery of the one surface of the moving plate 140 along the longitudinal direction.

The magnetic levitation rails 142 to 148 may include the third rail area 144 and/or the fourth rail area 148 that is configured to connect the first rail area 142 and the second rail area 146. In this case, the third rail area 144 and/or the fourth rail area 148, as illustrated in FIG. 1, may be disposed along a transverse direction of the moving plate 140.

Meanwhile, the magnetic levitation rails 142 to 148 may include an area for stopping any one shuttle such that the plurality of shuttles 162 and 164 are prevented from colliding with each other while the plurality of shuttles 162 and 164 are moved. In this way, the area for the stop may be included in specific partial areas of the magnetic levitation rails 142 to 148. Furthermore, the area for the stop may be selected as a partial area of the magnetic levitation rails 142 to 148 based on movement directions and/or locations of the plurality of shuttles 162 and 164.

Additionally or alternatively, the magnetic levitation rails 142 to 148 may include the third rail area 144 and/or the fourth rail area 148 for moving any one of the plurality of shuttles 162 and 164 from one periphery (that is, the first rail area 142) of the moving plate 140 to an opposite periphery (that is, the second rail area 146) of the moving plate 140.

The plurality of shuttles 162 and 164 may include the first shuttle 162 and/or the second shuttle 164. FIG. 1 illustrates that the plurality of shuttles 162 and 164 include two shuttles, but the present disclosure is not limited thereto. For example, the plurality of shuttles 162 and 164 may include three or more shuttles.

The plurality of shuttles 162 and 164 may accommodate one or more substrates. For example, an arbitrary one of the plurality of shuttles 162 and 164 may carry a target substrate that is to be processed in any one of the plurality of processing chambers 112 to 138, and may transfer the substrate to any one processing chamber. As another example, an arbitrary shuttle may transfer a substrate processed in any one processing chamber to the load lock chamber 170 while containing it.

The second shuttle 164 may be stopped in another predetermined area of the magnetic levitation rails 142 to 148 such that a path including one area of the magnetic levitation rails 142 to 148 is provided to the first shuttle 162. In this case, among the plurality of shuttles 162 and 164, a shuttle that is stopped in the another area may be determined as a shuttle that is located relatively close to the another area.

In detail, the first shuttle 162 is being moved upwards along the first rail area 142, and the second shuttle 164 is being moved downwards along the first rail area 142. In this case, the second shuttle 164 located relatively close to the fourth rail area 148 that is set to the another area may be moved to the fourth rail area 148 and may be stopped.

Accordingly, the first shuttle 162 may continue to be moved along the first rail area 142. However, the area, in which the second shuttle 164 is stopped, is not limited to the fourth rail area 148. For example, when the path including the another area has to be provided to the first shuttle 162, the second shuttle 164 may be stopped in the another area.

Meanwhile, although FIG. 1 illustrates an example of the plurality of shuttles 162 and 164 being moving along the same rail area, the present disclosure is not limited thereto. For example, the first shuttle 162 may be being moved from the first rail area 142 to the second rail area 146 via the third rail area 144, and the second shuttle 164 may be being moved from the second rail area 146 to the first rail area 142 via the third rail area 144.

In this case, the first shuttle 162 that is located relatively close to the fourth rail area 148 may be moved to the second rail area 146 via the fourth rail area 148. Accordingly, the second shuttle 164 may be moved to the first rail area 142 via the third rail area 144. That is, movement directions and/or stop locations of the plurality of shuttles 162 and 164 may be controlled not to collide with each other.

In this case, the movement directions and/or the stop locations of the plurality of shuttles 162 and 164 may be determined such that a total movement direction of the plurality of shuttles 162 and 164 is minimal. Due to the configuration, the substrate transfer apparatus 100 may enhance throughput and reduce energy consumption by providing efficient flows to the plurality of shuttles 162 and 164.

Hereinafter, the magnetic levitation rails and the shuttles of the substrate transfer apparatus will be described in detail with reference to FIGS. 2 to 4.

Figure 2:
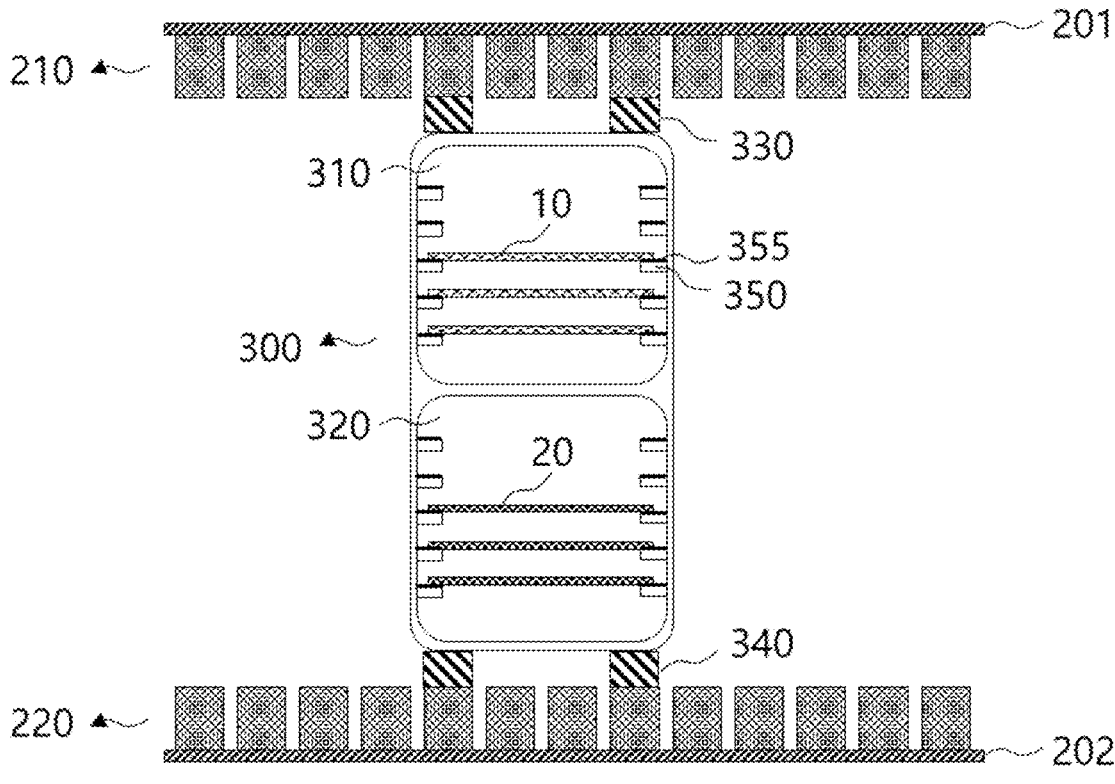
FIG. 2 is a view illustrating a substrate transfer apparatus according to an embodiment.

FIG. 2 is a view illustrating the substrate transfer apparatus according to an embodiment.

Referring to FIG. 2, the substrate transfer apparatus according to an embodiment may include an upper magnetic levitation rail 210, a lower magnetic levitation rail 220, and a shuttle 300. The moving plate may include the upper magnetic levitation rail 210 and the lower magnetic levitation rail 220.

The upper magnetic levitation rail 210 may be disposed on one surface 201 of the moving plate. Furthermore, the lower magnetic levitation rail 220 may be disposed on an opposite surface 202 of the moving plate. Then, the upper magnetic levitation rail 210 and the lower magnetic levitation rail 220 may be disposed to correspond to each other while facing each other.

According to an embodiment, a substrate is transferred by using only the lower magnetic levitation rail 220 disposed on a lower side to cause the shuttle to transfer the substrate. However, when the shuttle starts or stops on the lower magnetic levitation rail 220 or the robot arm draws the substrate from the shuttle, fine shaking occurs. Unlike the conventional technology, the substrate transfer apparatus of the present disclosure may include the upper magnetic levitation rail 210 to prevent fine shaking. That is, according to the present disclosure, a conventional problem may be solved by magnetically levitating the shuttle 300 on upper and lower sides of the shuttle 300 by using the upper magnetic levitation rail 210 as well as the lower magnetic levitation rail 220.

The upper magnetic levitation rail 210 and the lower magnetic levitation rail 220 may include a plurality of electromagnets. Then, as in FIG. 2, the electromagnet included in the upper magnetic levitation rail 210 and the electromagnet included in the lower magnetic levitation rail 220 may be disposed in one-to-one correspondence, but the present disclosure is not limited thereto and they may be disposed not to meet each other.

The shuttle 300 may be configured to accommodate the substrate. The shuttle 300 may be disposed between the upper magnetic levitation rail 210 and the lower magnetic levitation rail 220 and may move on the moving plate. The shuttle 300 may move on the moving plate to deliver the substrate to the processing chamber or move the substrate processed in the processing chamber.

The shuttle 300 may include a first space 310 and a second space 320 that are configured to accommodate one or more substrates. Then, the first space 310 and the second space 320 may be separated from each other. Environments of the first space 310 and the second space 320 may be set differently. For example, the first space 310 may be set to a vacuum state, and the second space 320 may be set to a non-vacuum state. Furthermore, for example, environments of the first space 310 and the second space 320, such as temperatures and/or humidity, may be set differently.

The first space 310 and the second space 320 may be disposed along one axis. For example, as in FIG. 2, the first space 310 and the second space 320 may be disposed along an axis that is perpendicular to one surface 201 or the opposite surface 202 of the moving plate. Then, the first space 310 may be disposed on an upper side of the second space 320. In this case, because a transverse area of the moving plate, which is occupied by the shuttle 300, is small, it may be efficient in an aspect of movement.

Furthermore, the first space 310 and the second space 320 may be disposed along an axis that is parallel to the one surface 201 or the opposite surface 202 of the moving plate. In detail, unlike FIG. 2, the first space 310 and the second space 320 may be disposed in parallel to each other laterally. In this case, because a distance between the one surface 201 and the opposite surface 202 of the moving plate becomes smaller, an area of the moving plate, which is occupied longitudinally, may become smaller.

Kinds of substrates that are accommodated in the first space 310 and the second space 320 may be different. In detail, the first space 310 may accommodate a substrate that is to be processed in the processing chamber, and the second space 320 may accommodate a substrate that has been processed in the processing chamber. Then, the first space 310 may be located on a lower side of the second space 320. In detail, because the processed substrate generates fumes on a surface thereof, the space, in which the processed substrate is accommodated, may be located on an upper side of the space, in which a substrate that is to be processed is accommodated, such that a processing surface of a surrounding substrate (a substrate that is to be processed) that has not been processed, is prevented from being damaged. However, the present disclosure is not limited thereto. Because the shuttle 300 accommodates substrates while classifying the substrates before and after the processing by the processing chamber, the substrates before and after the processing may be prevented from being confused.

Furthermore, because the first space 310 and the second space 320 of the shuttle 300 are separated from each other, environments that are optimized for the substrates before and after the processing may be provided. For example, the first space 310 may accommodate a substrate before processing in a vacuum state and the second space 320 may accommodate a substrate after processing in a non-vacuum state whereby the shuttle 300 may provide an environment that is optimized for the substrates.

The shuttle 300 may include a first permanent magnet 330 that is disposed to face the upper magnetic levitation rail 210, and a second permanent magnet 340 that is disposed to face the lower magnetic levitation rail 220. For example, as in FIG. 2, the first permanent magnet 330 may be disposed on an upper side of the shuttle 300 and the second permanent magnet 340 may be disposed on a lower side of the shuttle 300, but the present disclosure is not limited thereto. Furthermore, FIG. 2 illustrates that two permanent magnets are disposed on each of upper and lower sides of the shuttle 300, but the numbers of the permanent magnets are not limited thereto, and one, three, or four magnets may be disposed in each of them, and the numbers of the permanent magnets disposed on the upper side and the lower side may be different.

The first permanent magnet 330 and the second permanent magnet 340 may magnetically levitate the shuttle 300 by using an attractive force or a repulsive force between the upper magnetic levitation rail 210 and the lower magnetic levitation rail 220, respectively. The shuttle 300 may be moved between the upper magnetic levitation rail 210 and the lower magnetic levitation rail 220 by using the first permanent magnet 330 and the second permanent magnet 340.

The shuttle 300 may include a support member 350 that may support the substrate accommodated in an interior thereof. In detail, the first space 310 and/or the second space 320 of the shuttle 300 may include the support member 350 that is configured to support the substrate. The substrate may be disposed on the support member 350 to be moved by the shuttle 300. The support member 350 may support a substrate before processing, a substrate after processing, a dummy substrate, or a sensor having a shape of a substrate. Then, the dummy substrate may mean a test substrate for evaluating a stability, a performance, and the like of the entire apparatus.

According to an embodiment, a frictional member 355 may be disposed on one surface of the support member 350. In detail, the frictional member 355 may be disposed on, among several surfaces of the support member 350, one surface of the support member 350, which contacts a rear surface of the substrate. Then, the frictional member 355 may include a material having a large frictional coefficient such that the supported substrate is prevented from being shaken due to fine shaking of the shuttle 300. For example, the frictional member 355 may be neofrene or rubber, but the present disclosure is not limited thereto.

The shuttle 300 may include one or more sensors (not illustrated) in an interior thereof. In detail, a sensor that senses an interior environment may be disposed in the first space 310 and/or the second space 320 of the shuttle 300. The sensor may be a temperature sensor, a humidity sensor, a vibration sensor, a weight sensor, or an inclination sensor, but the present disclosure is not limited thereto.

For example, the first space 310 or the second space 320 may include a sensor that may measure a weight of the substrate or an inclination of the substrate. Furthermore, for example, the first space 310 or the second space 320 may include a sensor that may identify whether the temperature/humidity or a vacuum state of the space is properly set. Then, the sensor may have the same shape as that of the substrate, but the present disclosure is not limited thereto.

The sensor may sense overall environment information of the substrate transfer apparatus as well as an internal environment. In detail, the sensor may sense environment information in the processing chamber when the shuttle 300 enters the processing chamber. Furthermore, the sensor may sense environment information in the load lock chamber when the shuttle 300 enters the load lock chamber. In this way, the substrate transfer apparatus may sense the environment information in the apparatus by using the sensor of the shuttle 300.

Figure 3:
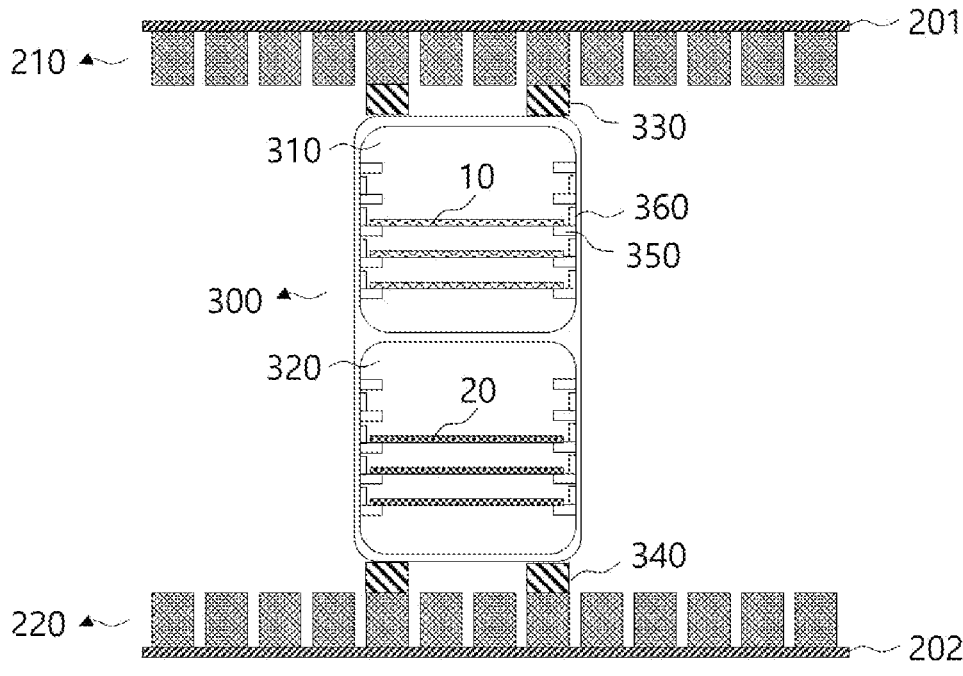
FIG. 3 is a view illustrating a substrate transfer apparatus according to an embodiment.

FIG. 3 is a view illustrating the substrate transfer apparatus according to another embodiment.

Referring to FIG. 3, the shuttle 300 of the substrate transfer apparatus according to the another embodiment may additionally include an impact absorbing member 360. In detail, the shuttle 300 may include the impact absorbing member 360 that may absorb an impact to protect the accommodated substrate even when the substrate is slid or shaken.

The impact absorbing member 360 may be disposed on one surface of the first space 310 or the second space 320. For example, as in FIG. 3, the impact absorbing member 360 may be disposed on a side surface of the first space 310 or the second space 320 to be adjacent to the support member 350, but the present disclosure is not limited thereto.

The impact absorbing member 360 may include a material that may absorb an impact. For example, the impact absorbing member 360 may be formed of a polymeric resin, such as a polyurethane, polycarbonate, polypropylene, or polyethylene, or may include an elastic material, such as rubber, a urethane-based material, or sponge formed by expanding an acryl-based material, but the present disclosure is not limited thereto.

Figure 4:
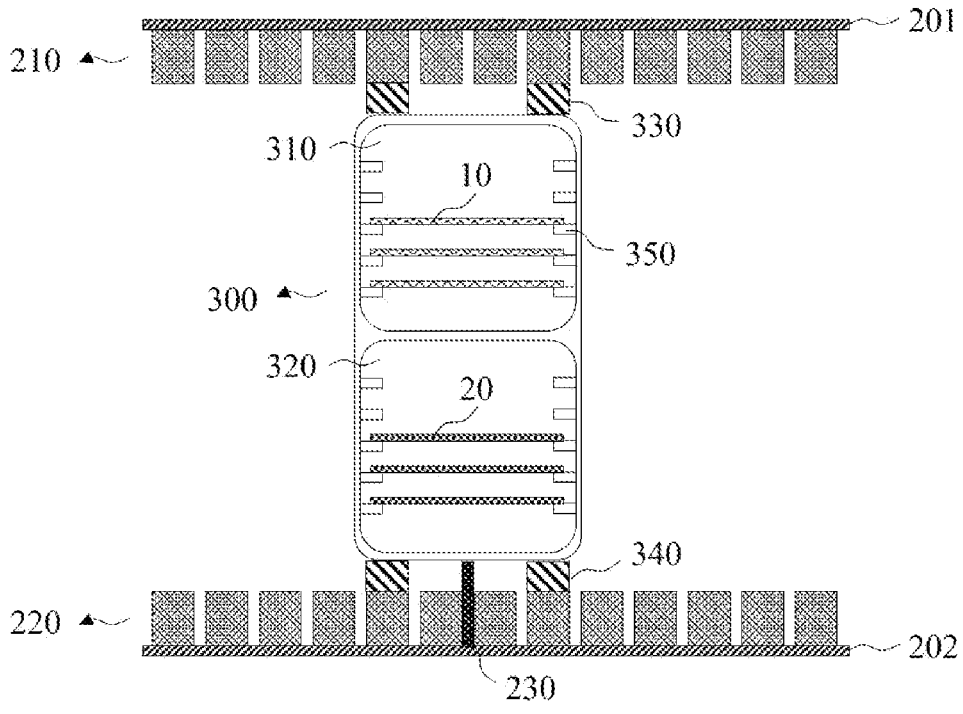
FIG. 4 is a view illustrating a substrate transfer apparatus according to another embodiment.

FIG. 4 is a view illustrating the substrate transfer apparatus according to another embodiment.

Referring to FIG. 4, the substrate transfer apparatus according to the another embodiment may further include a fixing pin 230. In detail, the moving plate may include the fixing pin 230 that fixes a location of the shuttle 300. For example, as in FIG. 4, the fixing pin 230 may be disposed between the electromagnets included in the upper magnetic levitation rail 210 or the lower magnetic levitation rail 220, but the present disclosure is not limited thereto.

The fixing pin 230 may or may not protrude under control of the controller of the substrate transfer apparatus. In detail, the fixing pin 230 may be controlled not to protrude when the shuttle 300 is moved, but may be controlled to protrude when the shuttle 300 is stopped. The fixing pin 230 may contact the shuttle 300 or pass through one surface of the shuttle 300 to fix the location of the shuttle 300. According to the present disclosure, fine shaking may occur when the robot arm extracts the substrate from the shuttle or introduce the substrate into the shuttle may be prevented by fixing the location of the shuttle 300 by using the fixing pin 230.

According to the embodiment of the present disclosure, the substrate transfer apparatus that stably transfers a substrate by using the upper and lower magnetic levitation rails may be provided.

The methods according to the embodiments may be implemented in a form of program instructions that may be performed through various computer means and may be recorded in a computer readable medium. The computer readable medium may include program instructions, data files, or data structures alone or in combination. The program instructions recorded in the medium may be particularly designed and configured for the embodiments, or may be known to an ordinary person in a computer software field to be used. Examples of computer readable recording mediums include hardware devices, such as magnetic media, such as hard disks, floppy disks, and magnetic tapes, optical media, such as CD-ROMs and DVDs, magneto-optical media, such as floptical disks, ROMs, RAMs, and flash memories, which are particularly configured to store and perform program instructions. Examples of program instructions include high-level language codes that may be executed by computers by using interpreters, as well as machine language codes that are made by compilers. The hardware devices may be configured to be operated as one or more software modules to perform operations of the embodiments, and reverse cases may be possible.

In this way, although the embodiments have been described with reference to the limited embodiments and the drawings, an ordinary person in the art, to which the present disclosure pertains, may make various corrections and modifications from the description. For example, the described technology may achieve suitable results even though they are performed in sequences that are different from those of the described method and/or the components, such as the described systems, structures, devices, or circuits, are coupled or combined in a form that is different from that of the described method or replaced by other components or equivalents.

Therefore, other implementations, other embodiments, and equivalents to the claims pertain to the scope of the claims, which will be described above.

What is claimed is:

1. A substrate transfer apparatus comprising:
   a moving plate including an upper magnetic levitation rail and a lower magnetic levitation rail;
   a processing chamber disposed adjacent to the moving plate and configured to process a substrate; and
   a shuttle disposed between the upper magnetic levitation rail and the lower magnetic levitation rail, moving on the moving plate, and configured to accommodate the substrate,
   wherein the shuttle includes a first space and a second space which are separated from each other, and
   wherein the first space accommodates a substrate that is to be processed in the processing chamber, and the second space accommodates a substrate that is processed in the processing chamber.

2. The substrate transfer apparatus of claim 1, wherein the first space is disposed on an upper side of the second space.

3. The substrate transfer apparatus of claim 1, wherein the shuttle includes a first permanent magnet disposed to face the upper magnetic levitation rail, and a second permanent magnet disposed to face the lower magnetic levitation rail.

4. The substrate transfer apparatus of claim 1, wherein the shuttle includes a support member configured to support the substrate, and wherein a frictional member is disposed on one surface of the support member.

5. The substrate transfer apparatus of claim 1, wherein the shuttle includes a sensor configured to sense an environment of an interior of the first space, an interior of the second space, the moving plate, or the processing chamber.

6. The substrate transfer apparatus of claim 5, wherein the sensor is a temperature sensor, a humidity sensor, a vibration sensor, a weight sensor, or an inclination sensor.

7. The substrate transfer apparatus of claim 1, wherein the moving plate includes a fixing pin configured to fix a location of the shuttle, and
   wherein the fixing pin is disposed between electromagnets of the upper magnetic levitation rail or the lower magnetic levitation rail.

8. The substrate transfer apparatus of claim 7, wherein the fixing pin contacts the shuttle or passes through one surface of the shuttle to fix the location of the shuttle.

9

9. The substrate transfer apparatus of claim 1, wherein an impact absorbing member is disposed on one surface of the first space or the second space.

10. The substrate transfer apparatus of claim 5, wherein the sensor is formed in the same form as that of the substrate.

11. A substrate transfer apparatus comprising:

a moving plate including an upper magnetic levitation rail and a lower magnetic levitation rail;

a processing chamber disposed adjacent to the moving plate and configured to process a substrate; and a shuttle disposed between the upper magnetic levitation rail and the lower magnetic levitation rail, moving on the moving plate, and configured to accommodate the substrate, wherein the shuttle includes a support member configured to support the substrate, and wherein a frictional member is disposed on one surface of the support member.

12. A substrate transfer apparatus comprising:

a moving plate including an upper magnetic levitation rail and a lower magnetic levitation rail;

a processing chamber disposed adjacent to the moving plate and configured to process a substrate; and a shuttle disposed between the upper magnetic levitation rail and the lower magnetic levitation rail, moving on the moving plate, and configured to accommodate the substrate, wherein the shuttle includes a first space and a second space configured to accommodate one or more substrates, wherein the first space and the second space are separated from each other, and wherein an impact absorbing member is disposed on one surface of the first space or the second space.

* * * * *